(12) United States Patent
Kanczuzewski et al.

(10) Patent No.: US 8,875,453 B2
(45) Date of Patent: Nov. 4, 2014

(54) SYSTEM FOR MOUNTING SOLAR MODULES

(71) Applicant: Kanzo, Inc., South Bend, IN (US)

(72) Inventors: Nicholas Kanczuzewski, Mishawaka, IN (US); Thomas J. Kanczuzewski, Buchanan, IL (US); Peter Rienks, South Bend, IN (US); Donald J. Nagy, South Bend, IN (US); John E. Townsend, Paw Paw, MI (US)

(73) Assignee: Kanzo, Inc., South Bend, IN (US)

( * ) Notice: Subject to any disclaimer, the term of this patent is extended or adjusted under 35 U.S.C. 154(b) by 0 days.

(21) Appl. No.: 13/839,103

(22) Filed: Mar. 15, 2013

(65) Prior Publication Data

US 2013/0334151 A1 Dec. 19, 2013

Related U.S. Application Data

(60) Provisional application No. 61/660,394, filed on Jun. 15, 2012, provisional application No. 61/666,507, filed on Jun. 29, 2012.

(51) Int. Cl.
| | |
|---|---|
| *F24J 2/52* | (2006.01) |
| *E04D 13/18* | (2014.01) |
| *H01L 31/042* | (2014.01) |
| *F16M 13/02* | (2006.01) |
| *H01L 31/048* | (2014.01) |

(52) U.S. Cl.
CPC .......... *H01L 31/0422* (2013.01); *F16M 13/02* (2013.01); *F24J 2/5237* (2013.01); *F24J 2/5239* (2013.01); *F24J 2/5258* (2013.01); *H01L 31/0484* (2013.01); *Y02E 10/50* (2013.01); *Y02B 10/12* (2013.01); *Y02E 10/47* (2013.01)

USPC .......... 52/173.3; 136/244; 257/433

(58) Field of Classification Search
USPC .......... 52/173.3; 136/251, 244, 291; 257/433; 126/621, 622, 623; D13/102
See application file for complete search history.

(56) References Cited

U.S. PATENT DOCUMENTS

| | | | | |
|---|---|---|---|---|
| 4,111,188 | A | * | 9/1978 | Murphy, Jr. ............. 126/622 |
| 7,406,800 | B2 | | 8/2008 | Cinnamon et al. |
| 7,592,537 | B1 | | 9/2009 | West |
| D613,243 | S | | 4/2010 | Burtt |
| 7,721,492 | B2 | | 5/2010 | Plaisted et al. |
| 7,832,157 | B2 | | 11/2010 | Cinnamon |
| 7,856,769 | B2 | | 12/2010 | Plaisted et al. |
| 7,857,269 | B2 | | 12/2010 | Plaisted et al. |
| D630,576 | S | | 1/2011 | Plaisted et al. |

(Continued)

*Primary Examiner* — William Gilbert
*Assistant Examiner* — Kyle Walraed-Sullivan
(74) *Attorney, Agent, or Firm* — Barnes & Thornburg LLP

(57) ABSTRACT

A system for mounting solar modules comprising a plurality of racks and clamps. Each rack has an inclined upper mounting surface to support one of the solar modules and an inclined lower mounting surface to support one of the other solar modules. Each upper mounting surface and lower mounting surface define a slot. One of the clamps slidably receivable by a slot of one of the upper mounting surfaces and configured to secure the one solar modules to the upper mounting surfaces and an other of the clamps slidably receivable by a slot of one of the lower mounting surfaces and configured to secure said one of the other solar modules to one of the lower mounting surfaces. Each rack has a tray having a first tower supporting the upper mounting surface and a second tower supporting the lower mounting surface.

25 Claims, 4 Drawing Sheets

(56) References Cited

U.S. PATENT DOCUMENTS

| | | |
|---|---|---|
| 7,866,098 B2 | 1/2011 | Cinnamon |
| 7,900,407 B2 | 3/2011 | Plaisted |
| D638,554 S | 5/2011 | Bub |
| 7,987,641 B2 | 8/2011 | Cinnamon |
| D645,981 S | 9/2011 | Zapfe et al. |
| 8,109,048 B2 | 2/2012 | West et al. |
| 8,177,180 B2 | 5/2012 | Plaisted et al. |
| 8,234,821 B2 | 8/2012 | Plaisted et al. |
| 8,256,170 B2 | 9/2012 | Plaisted et al. |
| 8,267,359 B2 | 9/2012 | Zante et al. |
| 8,272,174 B2 | 9/2012 | Stearns et al. |
| 8,294,022 B2 | 10/2012 | Lenox |
| 8,307,606 B1 | 11/2012 | Rego et al. |
| 8,316,590 B2 | 11/2012 | Cusson |
| 8,316,591 B2 | 11/2012 | Miyamoto et al. |
| 8,328,020 B2 | 12/2012 | Flossmann |
| 8,336,277 B1 | 12/2012 | Rego et al. |
| 8,344,239 B2 | 1/2013 | Plaisted |
| 8,360,050 B1 | 1/2013 | Albritton |
| 8,365,386 B2 | 2/2013 | Vontz et al. |
| 8,375,654 B1 | 2/2013 | West et al. |
| 8,375,936 B2 | 2/2013 | Albritton |
| 8,386,197 B1 | 2/2013 | Plaisted et al. |
| D677,619 S | 3/2013 | Truthseeker et al. |
| 8,424,255 B2 | 4/2013 | Lenox et al. |
| 8,424,821 B2 | 4/2013 | Liu |
| 8,635,818 B2 | 1/2014 | Wildes |
| 2003/0070368 A1* | 4/2003 | Shingleton .................. 52/173.3 |
| 2006/0118163 A1 | 6/2006 | Plaisted et al. |
| 2008/0310913 A1 | 12/2008 | Urban et al. |
| 2009/0078299 A1 | 3/2009 | Cinnamon et al. |
| 2009/0223315 A1 | 9/2009 | Needham |
| 2009/0256045 A1 | 10/2009 | Tunberg |
| 2009/0256046 A1 | 10/2009 | Hausner et al. |
| 2010/0147347 A1 | 6/2010 | Dyreby et al. |
| 2010/0147359 A1 | 6/2010 | Harberts et al. |
| 2010/0170501 A1 | 7/2010 | Albritton |
| 2010/0192505 A1 | 8/2010 | Schaefer et al. |
| 2010/0207951 A1 | 8/2010 | Plaisted et al. |
| 2010/0212714 A1 | 8/2010 | Rothschild et al. |
| 2010/0218798 A1 | 9/2010 | Cinnamon et al. |
| 2010/0245103 A1 | 9/2010 | Plaisted et al. |
| 2010/0276558 A1* | 11/2010 | Faust et al. ............... 248/222.14 |
| 2011/0000519 A1 | 1/2011 | West |
| 2011/0000520 A1 | 1/2011 | West |
| 2011/0000526 A1 | 1/2011 | West |
| 2011/0000544 A1 | 1/2011 | West |
| 2011/0005152 A1 | 1/2011 | Plaisted et al. |
| 2011/0108083 A1* | 5/2011 | Ravestein et al. ............. 136/244 |
| 2011/0120528 A1 | 5/2011 | West et al. |
| 2011/0174353 A1 | 7/2011 | Urban et al. |
| 2011/0174360 A1 | 7/2011 | Plaisted et al. |
| 2011/0209742 A1 | 9/2011 | Narayanamurthy |
| 2011/0220180 A1 | 9/2011 | Cinnamon et al. |
| 2011/0223850 A1 | 9/2011 | Narayanamurthy et al. |
| 2011/0238223 A1 | 9/2011 | Narayanamurthy et al. |
| 2011/0257795 A1 | 10/2011 | Narayanamurthy et al. |
| 2011/0277401 A1 | 11/2011 | Mathiowetz |
| 2011/0277402 A1 | 11/2011 | Schnitzer |
| 2011/0284058 A1 | 11/2011 | Cinnamon |
| 2012/0024343 A1 | 2/2012 | Narayanamurthy |
| 2012/0031470 A1 | 2/2012 | Dimov et al. |
| 2012/0036799 A1* | 2/2012 | Kneip et al. ................. 52/173.3 |
| 2012/0151721 A1 | 6/2012 | Lin |
| 2012/0152333 A1 | 6/2012 | Mittan et al. |
| 2012/0167364 A1 | 7/2012 | Koch et al. |
| 2012/0175322 A1 | 7/2012 | Park et al. |
| 2012/0186169 A1 | 7/2012 | Tomaso |
| 2012/0192399 A1 | 8/2012 | Dinh |
| 2012/0192926 A1 | 8/2012 | Kambara et al. |
| 2012/0193310 A1 | 8/2012 | Fluhrer et al. |
| 2012/0199180 A1 | 8/2012 | Salam |
| 2012/0201601 A1 | 8/2012 | Rizzo |
| 2012/0210543 A1 | 8/2012 | Lin |
| 2012/0216465 A1 | 8/2012 | Vari |
| 2012/0223032 A1 | 9/2012 | Rothschild et al. |
| 2012/0233958 A1 | 9/2012 | Stearns |
| 2012/0240489 A1 | 9/2012 | Rivera et al. |
| 2012/0248271 A1 | 10/2012 | Zeilenga |
| 2012/0255244 A1* | 10/2012 | Hendrickson et al. ....... 52/173.3 |
| 2012/0255598 A1 | 10/2012 | West |
| 2012/0260972 A1 | 10/2012 | West et al. |
| 2012/0266944 A1* | 10/2012 | Wildes ......................... 136/251 |
| 2012/0272613 A1 | 11/2012 | Cusson et al. |
| 2012/0273031 A1 | 11/2012 | Sagayama |
| 2012/0279554 A1 | 11/2012 | Bostwick |
| 2012/0279558 A1 | 11/2012 | West et al. |
| 2012/0291766 A1 | 11/2012 | Varga |
| 2012/0295534 A1 | 11/2012 | Narayanamurthy et al. |
| 2012/0298186 A1 | 11/2012 | West |
| 2012/0298188 A1 | 11/2012 | West et al. |
| 2012/0312373 A1 | 12/2012 | Hudson, Jr. et al. |
| 2013/0000230 A1 | 1/2013 | Sahlin et al. |
| 2013/0003274 A1 | 1/2013 | Turziano et al. |
| 2013/0008490 A1 | 1/2013 | Rego et al. |
| 2013/0020267 A1 | 1/2013 | Plaisted et al. |
| 2013/0043199 A1 | 2/2013 | Cusson |
| 2013/0068275 A1 | 3/2013 | Swahn et al. |
| 2013/0092215 A1 | 4/2013 | Schroeder et al. |
| 2013/0098858 A1 | 4/2013 | Cusson et al. |
| 2013/0108360 A1 | 5/2013 | Rayos |
| 2013/0112237 A1 | 5/2013 | Almogy et al. |
| 2013/0112247 A1 | 5/2013 | Li et al. |
| 2013/0112248 A1 | 5/2013 | McPheeters |
| 2013/0125492 A1 | 5/2013 | Molek et al. |
| 2013/0133270 A1 | 5/2013 | West et al. |
| 2013/0276867 A1 | 10/2013 | Wildes et al. |
| 2014/0014158 A1 | 1/2014 | Wildes et al. |

* cited by examiner

SYSTEM FOR MOUNTING SOLAR MODULES

CROSS REFERENCE TO RELATED APPLICATIONS

This application claims priority from U.S. Provisional Patent Applications Ser. Nos. 61/660,394 filed Jun. 15, 2012, and 61/666,507 filed Jun. 29, 2012, the contents of which applications are herein incorporated by reference in their entireties.

BACKGROUND AND SUMMARY

The present disclosure relates generally to a system for mounting solar modules.

Solar module racks are used to mount solar modules onto different types of roofs and grounds areas to form a photovoltaic array. Constructing or otherwise assembling the photovoltaic arrays is challenging for many different reasons. The photovoltaic arrays are located in outside environments and thus must be designed to withstand the outside elements. The photovoltaic arrays must be designed to live long lives. Further, as in most any industry, reducing costs is important and therefore the costs of the parts as well as ease of assembling are important in assembling photovoltaic arrays.

The present disclosure is directed to a system for mounting an array of solar modules comprising a plurality of racks and a plurality of clamps. Each rack has an inclined upper mounting surface adapted to support at least one of the solar modules along an angle and an inclined lower mounting surface configured to support at least one of the other solar modules along an angle. Each upper mounting surface and lower mounting surface defines a slot. One of the clamps is slidably receivable by a respective slot of one of the upper mounting surfaces and configured to secure said at least one of the solar modules to said one of the upper mounting surfaces. One of the other clamps is slidably receivable by a respective slot of one of the lower mounting surfaces and configured to secure said at least one of the other solar modules to said one of the lower mounting surfaces.

Each rack may comprise a tray having a first tower supporting the upper mounting surface, a second tower supporting the lower mounting surface extending generally parallel to the first tower, and a base interconnecting the first tower and the second tower. The first and second towers extend generally perpendicular to the base and the upper mounting surface and lower mounting surface extend at an angle relative to the base. The base may include a plurality of ribs extending between the upper and lower mounting surface configured to elevate ballast placed on the base and provide rigidity to the tray. The tray may have a rounded peripheral edge.

Each of the clamps may include a mounting bracket and each of the first and second towers may include a pair of lateral side walls defining opposed ends of the slot of each tower. The ends having a generally T-shaped cross section to slidingly receive a pair of the respective mounting brackets. Each of the upper and lower mounting surfaces may include a spacer having a pair of opposed sides, each opposed side for abutting a respective solar module to align a pair of the solar modules in a side-by-side manner on said each of the upper and lower mounting surfaces. Each of the spacers may include two portions separated by a respective slot defined by each of the upper and lower mounting surfaces.

The present disclosure is also directed to a method of assembling the array of solar modules with a plurality of the solar modules, racks 14 and clamps by engaging the solar modules and racks as described herein, installing the clamps on the racks as described herein, and clamping the solar modules to the racks as described herein.

Features and advantages of the disclosure will be set forth in part in the description which follows and the accompanying drawings described below, wherein an embodiment of the disclosure is described and shown, and in part will become apparent upon examination of the following detailed description taken in conjunction with the accompanying drawings.

BRIEF DESCRIPTION OF THE DRAWINGS

Other aspects and advantages of the present disclosure will become apparent upon consideration of the following detailed description, wherein similar structures have like or similar reference numerals.

DETAILED DESCRIPTION

The present disclosure is directed to a solar module system and components of the solar module system. While the present disclosure may be embodied in many different forms, several specific embodiments are discussed herein with the understanding that the present disclosure is to be considered only as an exemplification of the principles of the disclosure, and it is not intended to limit the disclosure to the embodiments illustrated.

Figure 1:
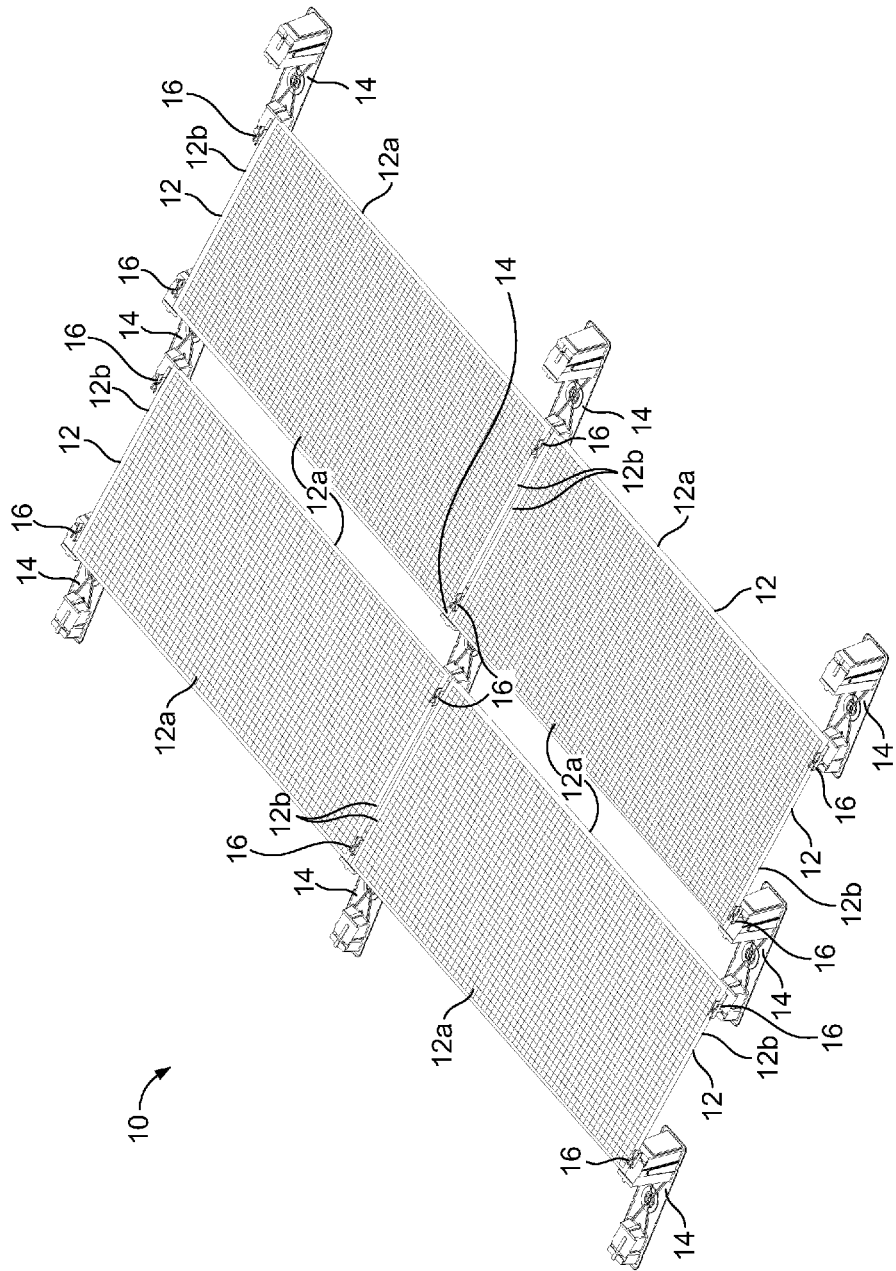
FIG. 1 is a perspective view of a photovoltaic array comprising a plurality of solar modules mounted to a low sloping roof by a solar racking system in accordance with an illustrated embodiment of the present disclosure.
Figure 2:
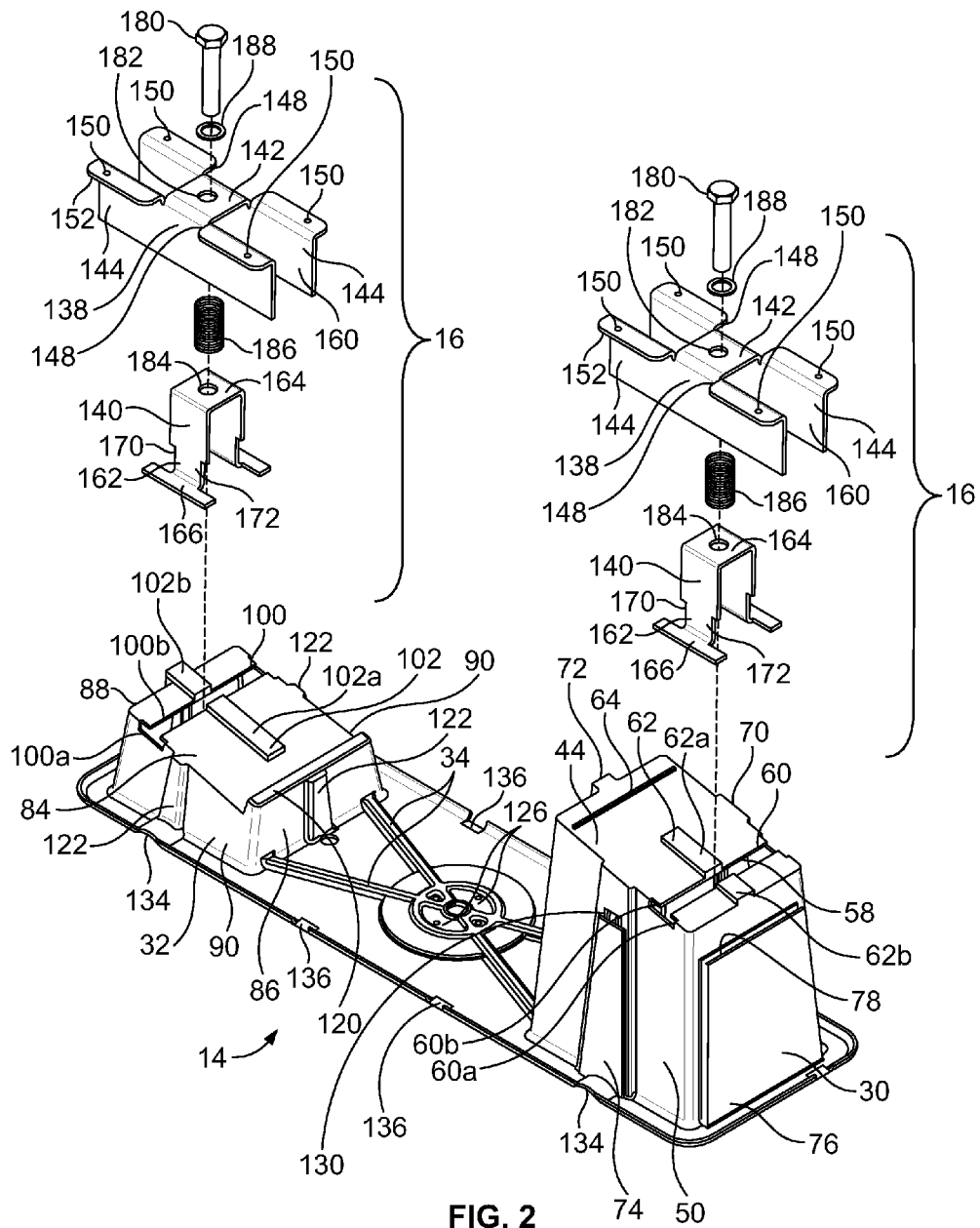
FIG. 2 is an exploded perspective view of one of the racks and a pair of the clamps of the solar racking system of FIG. 1.
Figure 3:
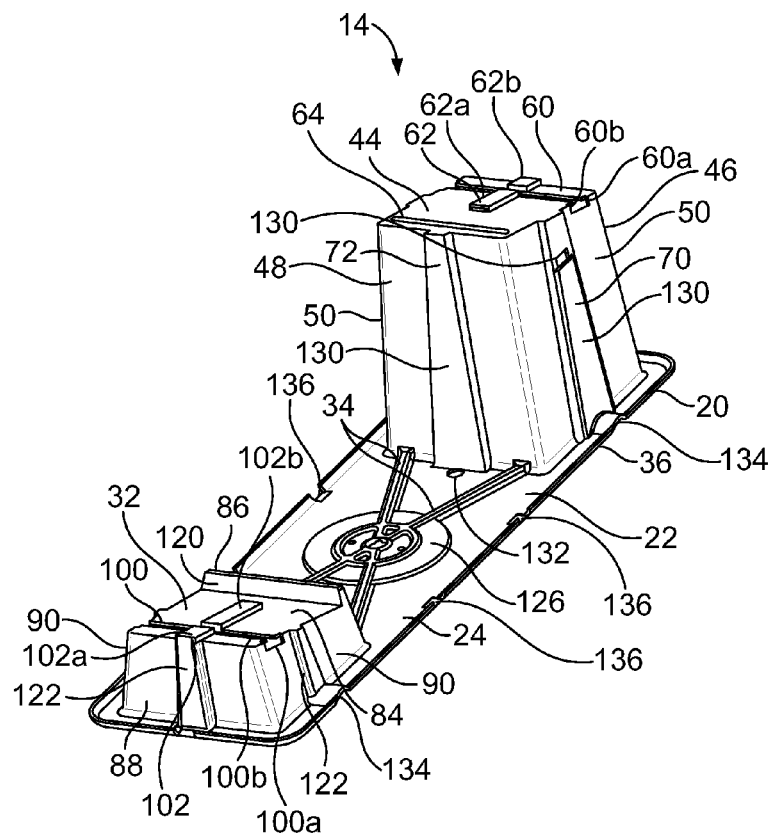
FIG. 3 is another perspective view of one of the racks of the solar racking system of FIG. 1.
Figure 4:
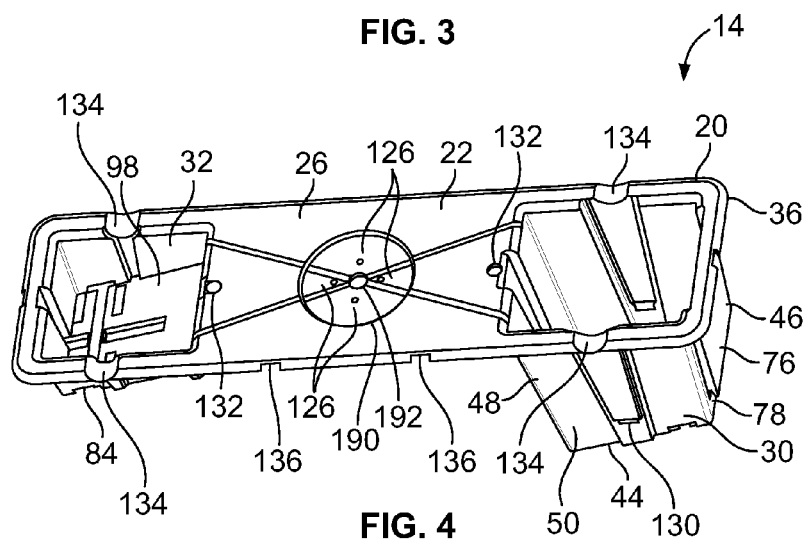
FIG. 4 is a bottom perspective of one of the racks of the solar racking system of FIG. 1.
Figure 5:
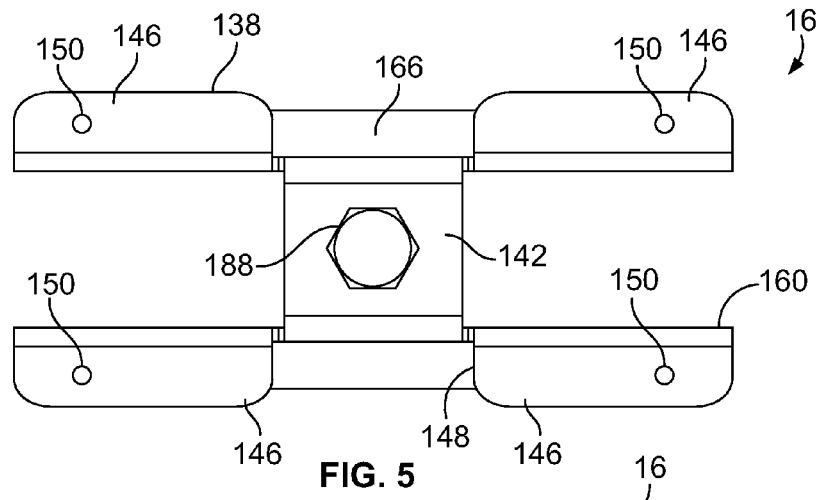
FIG. 5 is a top plan view of one of the clamps of the solar racking system of FIG. 1.
Figure 6:
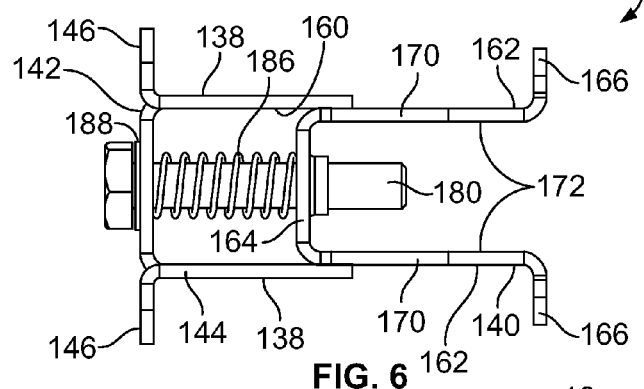
FIG. 6 is an end plan view of one of the clamps of the solar racking system of FIG. 1.
Figure 7:
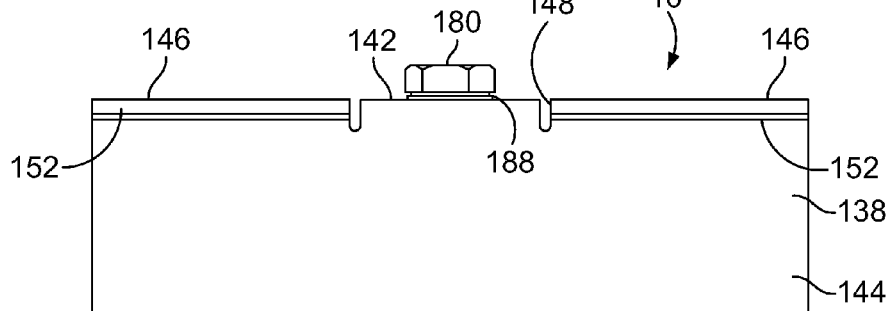
FIG. 7 is a side plan view of one of the clamps of the solar racking system of FIG. 1.

FIG. 1 illustrates a photovoltaic array 10 comprising two rows of solar modules 12 mounted to a low sloping roof or other roof or other surface by a solar racking system in accordance with an illustrated embodiment of the present disclosure. The illustrated solar racking system generally includes a plurality of racks 14 and a plurality of clamps 16 for securing the solar modules 12 to the racks. The photovoltaic array 10 may comprise any number of rows and columns of solar modules 12 or may have any other suitable configuration in accordance with other embodiments of the present disclosure.

Each of the illustrated solar modules 12 has a rectangular construction with a pair of opposed long sides 12a and a pair of opposed short sides 12b. The solar modules 12 may be of any suitable size and may have any other suitable geometry in accordance with other embodiments of the present disclosure. The solar modules 12 may be of any suitable construction, including, for example, commercially available solar modules and customized solar modules.

In the illustrated embodiment, each rack 14 includes a tray 20 comprising a base 22 having a top side 24 and a bottom side 26, a first tower 30 on the top side adjacent an end of the base, and a second tower 32 on the top side adjacent the other end of the base. The first and second towers 30 and 32 extend substantially perpendicular to the base 22. The base 22 includes a pair of ribs 34 to provide rigidity to base 22 and tray 20 and unify towers 30 and 32 and also to elevate ballast placed on the tray 20 above water that may collect on the tray 20. The illustrated ribs 34 extend from the first tower 30 to the second tower 32 and intersect and form an "X," but may have any other suitable construction and configuration in accordance with other embodiments. The peripheral edge 36 of the tray 20 is rounded to eliminate sharp edges to prevent damage to the roof or other structure on which the rack 14 is installed. Roof pads (not shown) or the like may be used below the tray 20 to further protect the roof or other structure.

Tower 30 comprises an inclined mounting surface 44 for engaging corner regions of a pair of the solar modules 12 to support the pair of solar modules, and a front wall 46, a rear wall 48, and a pair of lateral walls 50. Tower 30 is substantially hollow. Tower 30 includes a bottom side 58 of the mounting surface 44. The tower 30 also defines a slot 60 extending across a width of the mounting surface 44 extending from one lateral wall 50 to the other lateral wall 50. The end of the slot 60 at each lateral wall 50 has a cross section that is generally T-shaped in that it includes a cross stroke portion 60a and a stem portion 60b.

The mounting surface 44 of tower 30 includes a spacer 62 extending from the front wall 46 towards the rear wall 48. In the illustrated embodiment, the spacer 62 comprises two portions 62a and 62b separated by the slot 60. The spacer 62 is for engaging short sides 12b of one or both of a pair of the solar modules 12 to align one or both of the pair of the solar modules 12 on the mounting surface 44. The tower 30 also includes a module stop 64 on the mounting surface 44 adjacent the rear wall 48 extending from one lateral wall 50 to the other lateral wall 50 for engaging the long sides 12a of a pair of the solar modules 12. The module stop 64 may be omitted, especially with larger solar modules 12. The tower 30 also includes strengthening panels 70, 72 and 74 on walls 48 and 50 to add rigidity, and a strengthening panel 76 on the front wall 46 that also defines a slot 78 to receive a wire. Inclusion of the slot 78 prevents wires from touching the roof or other structure and from contacting standing water or the like that may accumulate on the base 22.

Tower 32 comprises an inclined mounting surface 84 for engaging corner regions of a pair of the solar modules 12 to support the pair of solar modules, and a front wall 86, a rear wall 88, and a pair of lateral walls 90. The angle of incline relative to the base 22 of the mounting surface 84 may be substantially the same as the angle of incline relative to the base of the mounting surface 44. Tower 32 is substantially hollow. Tower 32 includes a bottom surface 98 of the mounting surface 84. The tower 32 also defines a slot 100 extending across a width of the mounting surface 84 extending from one lateral wall 90 to the other lateral wall 90. The end of the slot 100 at each lateral wall 90 has a cross section that is generally T-shaped in that it includes a cross stroke portion 100a and a stem portion 100b.

The mounting surface 84 of tower 32 includes a spacer 102 extending from the rear wall 88 towards the front wall 86. In the illustrated embodiment, the spacer 102 comprises two portions 102a and 102b separated by the slot 100. The spacer 102 is for engaging short sides 12b of a pair of the solar modules 12 to align a pair of the solar modules 12 on the mounting surface 84. The tower 32 also includes a ledge 120 on the mounting surface 84 adjacent the front wall 86 extending from one lateral wall 90 to the other lateral wall 90 to engage the long sides 12a of a pair of the solar modules 12. The ledge 120 provides a natural stop for the solar module 12 during assembly and alignment of the solar module. The tower 32 also includes a strengthening panel 122 on each of walls 86, 88 and 90 to add rigidity. The rib 122 on front wall 86 may also function as a wind deflector. Each rack 14 may also include a wind deflector (not shown) associated with the rear wall 48 of the tower 30 or otherwise associated with the rack.

Because the tower 30 extends higher than the tower 32 and thus mounting surface 44 of tower 30 is disposed higher relative to the base 22 than mounting surface 84 of tower 32, mounting surface 44 is the upper mounting surface of the racks 14 for supporting one or two solar modules 12 and mounting surface 84 is the lower mounting surface of the racks 14 for supporting one or two solar modules 12. With reference to FIG. 1, for example, two pairs of racks 14 can support the same solar module 12 in a manner in which the solar module is supported by the mounting surfaces 44 of one of the pair of racks and the mounting surfaces 84 of the other pair of racks 14. The mounting surfaces 84 of the other pair of racks 14 can be used to support another solar module 12 that are also supported by yet another pair of racks 14, and the mounting surfaces 44 of such first pair of racks 14 can be used to also support another solar module 12 that are also supported by yet another pair of racks 14. Further, each of the towers 30 and 32 of the racks 14 can support two solar modules 12 in a side-by-side manner. Because the mounting surfaces 44 and 84 are inclined relative to the base 22, the towers 30 and 32 support the solar modules at an angle.

The illustrated rack 14 includes one or more drainage holes 126 defined by the base 22 to allow water to drain from the tray 20, thereby eliminating or reducing any water weight on the rack 14 that may cause damage to the rack 14 or the structure to which the system is attached. A plurality of apertures 130 may be disposed in walls forming the towers 30, 32. The apertures 130 accept clips that support a wire basket for north/south wire management or may be otherwise used for wire management. A pair of bores 132 and a pair of channels 134 may be defined at the bases of towers 30 and 32 and a plurality of drainage slots 136 may be defined on the base 22 for water drainage purposes.

The illustrated rack 14 also includes a raised center portion between towers 30 and 32 that also defines a circular bore 190 on the bottom side 26 of the rack and a central hole 192 for engaging a fastener. The raised center portion can be used to engage rooftop or other structures, such as for example, U-anchor products and similar structure.

The racks 14 may have any other suitable design and configuration in accordance with other embodiments of the present disclosure. The racks 14 may be constructed of an Acrylonitrile Styrene Acrylate (ASA) plastic, which is durable and highly resistant to the sun. The racks 14 may be constructed of any other suitable material in accordance with other embodiments of the present disclosure.

Each clamp 16 is configured to be slidingly received by one of the slots 60 or 100 of the racks 14 and to releasably lock one of the solar modules 12 to one of the racks 14 or a pair of the solar modules 12 in a side-by-side manner to one of the racks 14. Each of the illustrated clamps 16 includes a first clamp member 138, a second clamp member 140 sandwiched thereto, and a clamp actuator. The first clamp member 138 includes a bridge 142 and a pair of engaging members 144. The bridge 142 interconnects the engaging members 144 at the top ends of the engaging members. The engaging members 144 are wider than the bridge 142. The top end of each engaging member 144 includes a pair of flanges 146 extending outwardly away from the other engaging member 144. The flanges 146 on each engaging member 144 define a gap 148 adjacent the bridge 142 sized to align with spacers 62 and 102 of a respective rack 14 during installation of the clamp 16 on the solar rack 14 as hereinafter described. Flanges 146 function as top down clamps to clamp the short sides 12b of a pair of adjacent solar modules 12, and retain the pair of adjacent solar modules 12. Each of the flanges 146 may include a plurality of small spikes 150 on a lower surface 152 of the flanges 146 to create a positive ground between the solar modules 12. The illustrated spikes 150 are formed by punching holes in the flanges 146 causing spikes to form on the lower surface 152 around the punches. The bridge 140 and the engaging members 144 define a bore 160 for receiving the second clamp member 140.

The second clamp member 140 includes a pair of arms 162 and a connecting member 164 interconnecting top ends of the arms. Each of the arms 162 has a mounting bracket 166 at the bottom of the arms configured to be received in either of the ends of either of the slots 60 or 100 of one of the racks 14 and to engage a bottom surface 58 or 98 of the rack 14. Each arm 162 also includes a first portion 170 extending from the connecting member 164 having a width substantially the same as the width of the connecting member, but slightly less than the width of the bridge 142 of first clamp member 138, and a second portion 172 interconnecting the first portion 170 and the mounting bracket 166. The second portion 172 has a width less than the width of the first portion 170. The length of each of the mounting brackets 166 is greater than the width of the gaps 148 to provide added clamping surface area. The mounting brackets 166 may be omitted or may be interchangeable with other engaging structure in accordance with other embodiments of the present disclosure.

The first and second clamp members 138 and 140 are interconnected by a clamp actuator that may be in any suitable form configured to move the first and second clamp members between an engaged position and disengaged position. The clamp actuator is biased toward the disengaged position for ease of engagement of the clamp 16 and the one or two solar modules 12. In the illustrated embodiment, the clamp actuator is in the form of a threaded fastener 180 received in a hole 182 defined by the bridge 142 and a hole 184 defined by the connecting member 164, and a spring 186 disposed about the fastener 180 between the bridge 142 and the connecting member 164. The illustrated hole 184 is formed by a threaded punch or threaded cut. The spring 186 biases the fastener 180 toward the disengaged position for ease of installation of the clamp 16. The clamp actuator also includes a ring 188.

Rotation of the fastener 180 in one direction causes the second clamp member 140 to travel further into the bore 160 to the engaged position causing the mounting brackets 166 to travel towards the bottom side 58 or 98 of the engaging surface 44 or 84. When the clamp 16 is being installed, such movement causes the mounting brackets 166 to engage the bottom side 58 or 98 of the engaging surface 44 or 84, and causes flanges 144 to engage and clamp to the engaging surface 44 or 84 a solar module 12 disposed therebetween on either or both sides of the clamp 16 and to lock it in place relative to the rack 14. Rotation of the fastener 180 in the other direction causes the second clamp member 140 to move in an opposite direction relative to the first clamp member 138 to release the one or two solar modules 12 and to release the clamp 16 so that it can slide along the slot 60 or 100 of the rack 14.

The clamp 16 may have any other suitable design and configuration in accordance with other embodiments of the present disclosure. Similarly, each of the first clamp member 138, second clamp member 140 and clamp actuator may have any other suitable design and configuration in accordance with other embodiments of the present disclosure. Additionally, in the illustrated embodiment, the clamp 16 is shown for use in securing solar modules 12 to racks 14, but, in accordance with other embodiments of the present disclosure, the clamp 16 may be used to secure any other types of components to any other types of structure.

The photovoltaic array 10 in accordance with an illustrated embodiment of the present disclosure may be assembled by positioning a plurality of racks 14 on the roof or other structure. Two racks 14 may be positioned along the short sides 12b of each pair of adjacent solar modules 12 near the ends of the adjacent long sides 12a of the two solar modules. Similarly, as for the solar modules 12 at the ends of the rows in the array 10, two racks 14 may be positioned along the other short side 12b of the solar module 12 near the ends of the long side 12 of the solar module. The solar modules 12 may then be placed on the racks 14 such that each solar module 12 is supported by a pair of mounting surfaces 44 of two racks 14 and a pair of mounting surfaces 84 of two other racks 14.

The solar modules 12 are positioned in engagement with the spacers 62 and 102 on each of the mounting surfaces 44 and 84. Each pair of mounting surfaces 44 may support another solar module 12 and each pair of mounting surfaces 84 may support another solar module 12. The spacers 62 and 102 provide ease of alignment of the solar modules 12 on the towers 30 and 32. The module stop 64 of the tower 30 and the ledge 120 of the tower 32 also provide ease of alignment of the solar modules 12 on the racks 14.

Clamps 16 are then installed on the racks 14 to engage the solar modules 12 and to secure the solar modules to the racks. This may be achieved by securing each clamp 16 one at a time with a corresponding first or second mounting tower 30 or 32 of one of the racks 14 in the following manner. The clamp 16 is engaged with one of the racks by inserting the mounting brackets 166 and second portion 172 of the clamp into the ends of one of the slots 60 or 100. The clamp 16 is then slidingly received into the slot 60 or 100 and is then slid into place over the spacer 62 or 102. The fastener 180 is rotated to engage the short sides 12b of one solar module 12 to secure one of the solar modules 12 to the rack 14, or to engage two adjacent solar modules 12 and to secure the pair of the solar modules to the rack in a side-by-side manner. In this position, flanges 146 are engaged with a solar module 12 on one or both sides of the bridge 142, and mounting brackets 166 are engaged with the bottom side 58 or 98 of the mounting surface 44 or 84. Thereafter, or contemporaneously, an other clamp 16 is secured to one of the other towers 30 or 32 of the racks 14 in a similar manner. Each solar module 12 is secured to four racks 14 and an additional solar module may be secured to each of those four racks by the same clamp 16 on each of the four racks. The assembly of the photovoltaic array 10 may also be staged so that it is assembled first and thereafter positioned on the roof or other surface.

Accordingly, each upper mounting surface 44 of each pair of racks 14 is configured to support a pair of solar modules 12 that are also supported by and extend from lower mounting surfaces 64 of another pair of racks. The system 10 can be used to support rows and/or columns of solar modules 12. By way of example, six of said racks may be use to support two solar modules 12 and eight of clamps 16 can be used to releasably secure the two solar modules to the racks in a side-by-side manner. By way of further example, nine of the racks 14 may be use to support at least two substantially parallel rows of two solar modules 12, and twelve of the clamps 16 can be used to releasably secure the solar modules to the racks.

The system in accordance with an illustrated embodiment of the present disclosure provides many benefits. It is easy to install and may be installed with a single tool, thus saving time and energy during installation. The racks 14 and clamps 16 are relatively inexpensive compared to other technologies. Additionally, each clamp is one piece which provides for ease of assembly. The system also enables the clamping to occur along short sides 12b of solar modules. By attaching the racks 14 to the solar modules 12 along the short sides 12b (rather than the long sides 12a), adjacent solar modules 12 share a connection. It also provides an integrated grounding between solar modules and also entire grounding through an array of solar modules. This integrated grounding provides a positive ground throughout the system 10, thereby making it unnecessary to install a separate grounding wire and lugs into the solar module array and providing a large savings in copper wire, ground lugs, and installation time. The clamp 16, as described above, can easily click into place within the slot of the rack 14. This may reduce the number of racks 14 and connections, thereby reducing installation time and costs. The design of the rack 14 also provides for stackability of multiple racks 14. This reduces the shipping and handling costs, allowing large quantities of racks to be shipped at the same time.

The present disclosure is also directed to a method of assembling the array of solar modules with a plurality of solar modules 12, racks 14 and clamps 16 by engaging the solar modules 12 and racks 14 in any suitable manner described above, installing the clamps 16 on the racks 14 in any suitable manner described above, and clamping the solar modules 12 to the racks in any suitable manner described above. For example, the method may include (a) placing a first of the solar modules 12 on inclined upper mounting surfaces 44 of a pair of first racks 14 and on inclined lower mounting surfaces 84 of a pair of second racks 14; (b) engaging a first clamp 16 with the upper mounting surface of one of the first racks by inserting a mounting bracket of the first clamp within the slot defined by the upper mounting surface of the one first rack, sliding the first clamp along the slot defined by the upper mounting surface of the one first rack and clamping the first solar module to the one first rack; (c) engaging a second clamp 16 with the upper mounting surface of the other first rack by inserting a mounting bracket of the second clamp within the a slot defined by the upper mounting surface of the other first rack, sliding the second clamp along the slot defined by the upper mounting surface of the other first rack and clamping the first solar module to the other first rack; (d) engaging a third clamp 16 with the lower mounting surface of one of the second racks by inserting a mounting bracket of the third clamp within the slot defined by the lower mounting surface of one of the second rack, sliding the third clamp along the slot defined by the lower mounting surface of the one second rack and clamping the first solar module to the one second rack; and (e) engaging a fourth clamp 16 with the lower mounting surface of the other second rack by inserting a mounting bracket of the fourth clamp within the slot defined by the lower mounting surface of the other second rack, sliding the fourth clamp along the slot defined by the lower mounting surface of the other second rack and clamping the first solar module to the other second rack.

The method may further include placing a second of the solar modules 12 on the upper mounting surface 44 of the one first rack 14, on the lower mounting surface 84 of the one second rack 14, on an inclined upper mounting surface 84 of a third rack 14 and on a lower mounting surface of a fourth rack 14; clamping the second solar module to the upper mounting surface of the one first rack with the first clamp during (b); clamping the second solar module to the lower mounting surface of the one second rack with the third clamp during (d); engaging a fifth clamp 16 with the upper mounting surface of the third rack by inserting a mounting bracket of the fifth clamp within the slot defined by the upper mounting surface of the third rack, sliding the fifth clamp along the slot defined by the upper mounting surface of the third rack and clamping the second solar module to the third rack; and engaging a sixth clamp 16 with the lower mounting surface of the fourth rack by inserting a mounting bracket of the sixth clamp within the slot defined by the lower mounting surface of the fourth rack, sliding the sixth clamp along the slot defined by the lower mounting surface of the fourth rack, and clamping the second solar module to the fourth rack.

While embodiments have been illustrated and described in the drawings and foregoing description, such illustrations and descriptions are considered to be exemplary and not restrictive in character, it being understood that only illustrative embodiments have been shown and described and that all changes and modifications that come within the spirit of the disclosure are desired to be protected. The description and figures are intended as illustrations of embodiments of the disclosure, and are not intended to be construed as having or implying limitation of the disclosure to those embodiments. There are a plurality of advantages of the present disclosure arising from various features set forth in the description. It will be noted that alternative embodiments of the disclosure may not include all of the features described yet still benefit from at least some of the advantages of such features. Those of ordinary skill in the art may readily devise their own implementations of the disclosure and associated methods, without undue experimentation, that incorporate one or more of the features of the disclosure and fall within the spirit and scope of the present disclosure and the appended claims.

The invention claimed is:

1. A system for mounting an array of rows of solar modules comprising:

a plurality of racks, each rack having an inclined upper mounting surface adapted to support on a roof or other surface at least one of the solar modules along an angle relative to the roof or other surface and an inclined lower mounting surface configured to support at least one of the other solar modules of one row along an angle relative to the roof or other surface and one other solar module of another row, each upper mounting surface and each lower mounting surface defining a slot, each rack being spaced from all of the other racks; and a plurality of clamps, one of the clamps slidably receivable by a respective slot of one of the upper mounting surfaces and configured to secure said at least one of the solar modules to said one of the upper mounting surfaces and another of the clamps slidably receivable by a respective slot of one of the lower mounting surfaces and configured to secure said at least one of the other solar modules to said one of the lower mounting surfaces such that said at least one of the solar modules and said at least one of the other solar modules are disposed in adjacent rows of the array;

wherein each of the upper mounting surface and lower mounting surface has a front side, a rear side and a pair of lateral sides, the slot of the upper mounting surface extends from one of the lateral sides of the upper mounting surface to the other of the lateral sides of the upper mounting surface and the slot of the lower mounting surface extends from one of the lateral sides of the lower mounting surface to the other of the lateral sides of the lower mounting surface.

2. The system of claim 1 wherein each rack comprises a tray having a first tower supporting the upper mounting surface, a second tower supporting the lower mounting surface extending generally parallel to the first tower, and a base interconnecting the first tower and the second tower.

3. The system of claim 2 wherein the first and second towers extend generally perpendicular to the base and the upper mounting surface and lower mounting surface extend at an angle relative to the base.

4. The system of claim 2 wherein the base includes a plurality of ribs extending between the upper and lower mounting surface configured to elevate ballast placed on the base and to provide rigidity to the tray.

5. The system of claim 2 wherein at least one of the first tower and second tower includes at least one wall having a panel to increase rigidity of said one of the first tower and second tower.

6. The system of claim 2 wherein each of the first tower and second tower includes at least one wall having a panel to increase rigidity of a respective first tower and second tower.

7. The system of claim 2 wherein the first tower includes a wall including a panel defining a slot to receivingly engage a wire.

8. The system of claim 2 wherein the tray has a rounded peripheral edge.

9. The system of claim 2 wherein each clamp includes flanges extending in opposite directions for engaging a pair of adjacent solar modules.

10. The system of claim 2 wherein each clamp includes a first clamp member, a second clamp member and a clamp actuator configured to move the second clamp member between an engaged position and a disengaged position, the clamp being secured to one of the first tower and second tower when the second clamp is received by the slot of said one of the first tower and second tower and moved to the engaged position.

11. The system of claim 10 wherein the first tower includes a bottom side of the upper mounting surface and the second tower includes a bottom side of the lower mounting surface, the first clamp member including flanges extending in opposite directions for engaging a pair of adjacent solar modules and the second clamp member including a pair of mounting brackets for engaging the bottom surface of said one of the first tower and second tower when the second clamp member is moved to the engaged position.

12. The system of claim 2 wherein the first tower includes a bottom side of the upper mounting surface and each of the clamps includes a pair of mounting brackets, the first tower includes a pair of lateral side walls defining opposed ends of the slot of the first tower, the ends having a generally T-shaped cross section to slidingly receive the mounting brackets, the mounting brackets configured to engage the bottom side of the upper mounting surface to secure the clamp to the first tower.

13. The system of claim 2 wherein each of the second towers includes a bottom side of the lower mounting surface and each of the clamps includes a pair of mounting brackets, the second tower includes a pair of lateral side walls defining opposed ends of the slot of the second tower, the ends having a generally T-shaped cross section to slidingly receive the mounting brackets, the mounting brackets configured to engage the bottom side of the lower mounting surface to secure the clamp to the second tower.

14. The system of claim 1 wherein each of the upper and lower mounting surfaces includes a spacer having a pair of opposed sides, each opposed side for abutting a respective solar module to align a pair of the solar modules in a side-by-side manner on said each of the upper and lower mounting surfaces.

15. The system of claim 14 wherein each of the spacers includes two portions separated by a respective slot defined by each of the upper and lower mounting surfaces.

16. The system of claim 1 wherein each rack defines a plurality of holes for draining water from the rack.

17. The system of claim 1 wherein the upper mounting surface of each rack is configured to support one of the solar modules supported by the lower mounting surface of another rack.

18. The system of claim 1 wherein the upper mounting surface of each rack is configured to support a pair of the solar modules supported by the lower mounting surface of another rack.

19. The system of claim 1 wherein there are six of said racks adapted to support two of said solar modules and eight of said clamps configured to secure said two solar modules to said six racks.

20. The system of claim 1 wherein there are nine of said racks adapted to support two rows of two solar modules, and twelve of said clamps configured to secure said solar modules to said nine racks.

21. A system for mounting an array of rows of solar modules comprising:
a plurality of racks, each rack having a first tower and a second tower, the first tower including an inclined upper mounting surface adapted to support on a roof or other surface at least one of the solar modules of one row along an angle relative to the roof or other surface, the second tower including an inclined lower mounting surface configured to support at least one of the other solar modules of another row along an angle, each upper mounting surface and lower mounting surface defining a slot each rack being spaced from all of the other racks; and
a plurality of clamps, one of the clamps slidably receivable by a respective slot of one of the upper mounting surfaces and configured to secure a pair of the solar modules to said one of the upper mounting surfaces and an other of the clamps slidably receivable by a respective slot of one of the lower mounting surfaces and configured to secure an other pair of the other solar modules to said one of the lower mounting surfaces such that said at least one of the solar modules and said at least one of the other solar modules are disposed in adjacent rows of the array;
wherein each of the upper mounting surface and lower mounting surface has a front side, a rear side and a pair of lateral sides, the slot of the upper mounting surface extends from one of the lateral sides of the upper mounting surface to the other of the lateral sides of the upper mounting surface and the slot of the lower mounting surface extends from one of the lateral sides of the lower mounting surface to the other of the lateral sides of the lower mounting surface.

22. The system of claim 21 wherein each of the upper and lower mounting surfaces includes a spacer having a pair of opposed sides, each opposed side for abutting a respective solar module to align the pair of the solar modules in a side-by-side manner on said upper mounting surface and aligning the other pair of solar modules in a side-by-side manner on the lower mounting surface.

23. The system of claim 22 wherein each of the spacers includes two portions separated by a respective slot defined by each of the upper and lower mounting surfaces.

24. The system of claim 1 wherein each of the upper and lower mounting surfaces includes a spacer having a pair of opposed sides, each opposed side extending generally perpendicular to a respective slot, each opposed side for abutting a respective solar module to align a pair of the solar modules in a side-by-side manner on said each of the upper and lower mounting surfaces.

25. The system of claim 24 wherein each of the spacers includes two portions separated by the respective slot defined by each of the upper and lower mounting surfaces.

* * * * *

UNITED STATES PATENT AND TRADEMARK OFFICE
CERTIFICATE OF CORRECTION

| | | |
|---|---|---|
| PATENT NO. | : 8,875,453 B2 | Page 1 of 1 |
| APPLICATION NO. | : 13/839103 | |
| DATED | : November 4, 2014 | |
| INVENTOR(S) | : Kanczuzewski et al. | |

It is certified that error appears in the above-identified patent and that said Letters Patent is hereby corrected as shown below:

On Title page, under Item (72), the residence of the second inventor should read as follows:

Thomas J. Kanczuzewski, Buchanan, MI (US)

Signed and Sealed this
Twenty-first Day of April, 2015

Michelle K. Lee
*Director of the United States Patent and Trademark Office*